(12) United States Patent
Brebner et al.

(10) Patent No.: US 8,560,996 B1
(45) Date of Patent: Oct. 15, 2013

(54) METHOD AND SYSTEM FOR PREPARING MODULARIZED CIRCUIT DESIGNS FOR DYNAMIC PARTIAL RECONFIGURATION OF PROGRAMMABLE LOGIC

(75) Inventors: Gordon J. Brebner, San Jose, CA (US); Christopher E. Neely, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 64 days.

(21) Appl. No.: 13/027,667

(22) Filed: Feb. 15, 2011

(51) Int. Cl.
 *G06F 17/50* (2006.01)
(52) U.S. Cl.
 USPC ......................................... 716/117; 716/116
(58) Field of Classification Search
 USPC ................................. 716/116–120
 See application file for complete search history.

(56) References Cited

U.S. PATENT DOCUMENTS

| | | | |
|---|---|---|---|
| 7,461,362 B1 * | 12/2008 | Caldwell et al. | 716/132 |
| 7,600,210 B1 * | 10/2009 | Mason et al. | 716/138 |
| 7,616,027 B2 * | 11/2009 | Schmit et al. | 326/47 |
| 7,640,527 B1 * | 12/2009 | Dorairaj et al. | 716/139 |
| 7,669,163 B1 | 2/2010 | Camilleri et al. | |
| 7,818,163 B2 * | 10/2010 | Lertora et al. | 703/28 |
| 7,852,117 B1 | 12/2010 | Lo et al. | |
| 7,958,473 B2 * | 6/2011 | Dirks et al. | 716/108 |

* cited by examiner

*Primary Examiner* — Binh Tat
(74) *Attorney, Agent, or Firm* — LeRoy D. Maunu; Lois D. Cartier

(57) ABSTRACT

Approaches for dynamically reconfiguring a programmable integrated circuit (IC) are disclosed. In response to user input to a reconfiguration controller while a circuit is operating in programmable resources of the programmable IC, a replacement module and a module to be replaced in the circuit are selected. A process determines whether or not interfaces of the replacement module are compatible with interfaces of the circuit to the module to be replaced. In response to the interfaces of the replacement module and the interfaces of the circuit to the module to be replaced being compatible, the programmable IC is partially reconfigured with a realization of the replacement module in place of a realization of the module to be replaced.

20 Claims, 4 Drawing Sheets

METHOD AND SYSTEM FOR PREPARING MODULARIZED CIRCUIT DESIGNS FOR DYNAMIC PARTIAL RECONFIGURATION OF PROGRAMMABLE LOGIC

FIELD OF THE INVENTION

One or more embodiments generally relate to preparing modularized circuit designs for dynamic reconfiguration of programmable logic.

BACKGROUND

Programmable logic integrated circuits (ICs) are a type of programmable integrated circuit (IC) having circuitry that may be programmed or configured by a user to perform specified logic functions. There are different types of programmable logic ICs, such as programmable logic arrays (PLAs) and complex programmable logic devices (CPLDs). One type of programmable logic IC, known as a field programmable gate array (FPGA), is very popular because of a superior combination of capacity, flexibility, time-to-market, and cost.

An FPGA typically includes an array of configurable logic blocks (CLBs) and programmable input/output blocks (IOBs). The CLBs and IOBs are interconnected by a programmable interconnect structure. The CLBs, IOBs, and interconnect structure are typically programmed by loading a stream of configuration data (known as a bitstream) into internal configuration memory cells that define how the CLBs, IOBs, and interconnect structure are configured. An FPGA may also include various dedicated logic circuits, such as memories, microprocessors, digital clock managers (DCMs), and input/output (I/O) transceivers.

Some programmable ICs are configured to support dynamic reconfiguration. That is, some programmable ICs have the ability to reprogram a portion of the programmable logic while the rest of the programmable logic continues to operate according to the configured logic functions. In creating a system that supports dynamic partial reconfiguration, the designer will particularly architect the design to allow for dynamic partial reconfiguration. That is, the designer will specify modules that may be dynamically replaced. In addition, the designer must specify suitable interfaces that support the dynamic partial reconfiguration. Since a portion of the device may be reconfigured while the device is active, predefined macros or other entities are used to interface to the reconfigurable modules. One such instantiation of this implementation uses three-state buffer (tbuf) macros (also referred to as bus macros) as the interfaces of the reconfigurable modules. During reconfiguration, the tbuf macros allow a given module to be isolated from the portion of the design that is not being reconfigured. U.S. Pat. No. 7,669,163 describes an example implementation that uses tbuf macros.

Though tools exist to design and implement applications that support dynamic partial reconfiguration, there are few tools that provide support for user-level management of dynamic partial reconfiguration of the application while the application is running. For example, if an end-user or someone other than the designer wants to initiate dynamic partial reconfiguration of an application, the options available to the end-user may be limited to those contemplated by the designer when the application was implemented. Alternatively, if the end-user has enough of the original design information, the proper design tools, and the requisite skills, the end-user may create the desired modules to be used in the dynamic partial reconfiguration. Neither alternative may be viable in many instances.

A method and system that addresses these and other issues is therefore desirable.

SUMMARY

Embodiments of the invention are directed to dynamic reconfiguration of a programmable integrated circuit (IC). In one embodiment, a method of dynamically reconfiguring a programmable IC includes, in response to user input to a reconfiguration controller while a circuit is operating in programmable resources of the programmable IC, selecting a replacement module and a module to be replaced in the circuit. The method determines whether or not interfaces of the replacement module are compatible with interfaces of the circuit to the module to be replaced. In response to the interfaces of the replacement module and the interfaces of the circuit to the module to be replaced being compatible, the method partially reconfigures the programmable IC with a realization of the replacement module in place of a realization of the module to be replaced.

In another embodiment, a system is provided for dynamically reconfiguring a programmable IC. The system includes a memory arrangement configured with processor-executable instructions and at least one processor coupled to the memory arrangement. Execution of the instructions by the at least one processor causes the at least one processor to perform operations including selecting, in response to user input to a reconfiguration controller while a circuit is operating in programmable resources of the programmable IC, a replacement module and a module to be replaced in the circuit. The operations include determining whether or not interfaces of the replacement module are compatible with interfaces of the circuit to the module to be replaced. In response to the interfaces of the replacement module and the interfaces of the circuit to the module to be replaced being compatible, an operation partially reconfigures the programmable IC with a realization of the replacement module in place of a realization of the module to be replaced.

It will be appreciated that various other embodiments are set forth in the Detailed Description and Claims which follow.

BRIEF DESCRIPTION OF THE DRAWINGS

Various aspects and advantages will become apparent upon review of the following detailed description and upon reference to the drawings, in which.

DETAILED DESCRIPTION

In one or more embodiments, approaches are disclosed for dynamic partial reconfiguration of a programmable integrated circuit (IC). High-level, metadata-driven approaches, which are common to design tools, are used in managing a system while the system is in operation. The embodiments support presentation of a consistent level of abstraction to a user, from system design to system operation and management.

A reconfiguration controller receives user input and controls the task of dynamic partial reconfiguration. The user specifies the module to be replaced ($M_{TBR}$) and a replacement module ($M_R$), and the reconfiguration controller selects the $M_R$ from a user-specified source or from a library of replacement modules.

The reconfiguration controller uses information that describes the interfaces (metadata) to determine whether or not the $M_R$ is suitable to replace the $M_{TBR}$ in the circuit design. The reconfiguration controller has access to metadata that describe the interfaces of the circuit design for modules that are eligible for replacement and metadata that describe the interfaces of the $M_R$. This allows parties other than the original creator of the circuit design and parties other than the user to provide replacement modules. If the interfaces of the $M_R$ and the circuit design are compatible, the reconfiguration controller partially reconfigures the programmable IC with a realization of the $M_R$ in place of a realization of the $M_{TBR}$.

Figure 1:
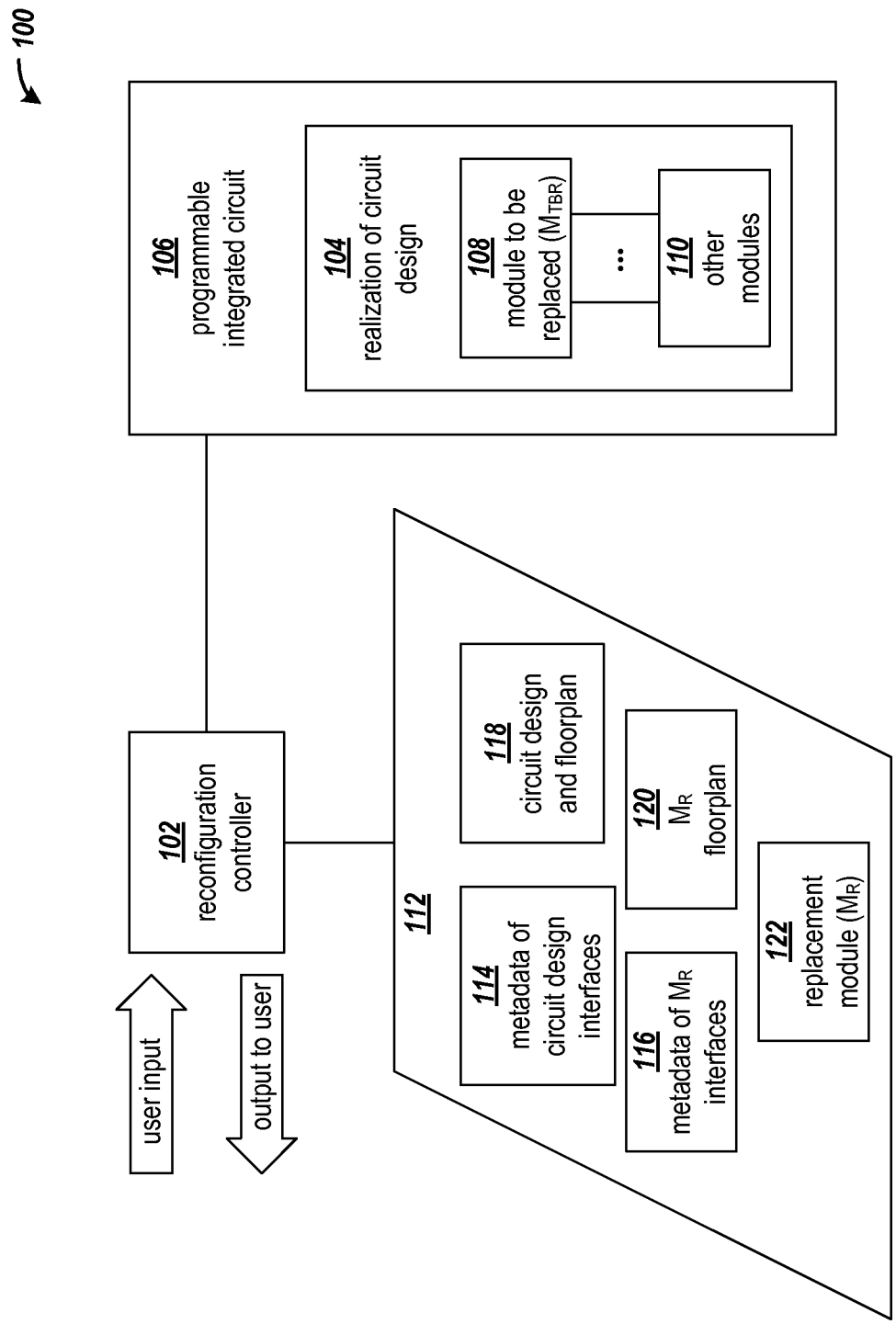
FIG. 1 is a block diagram of a system for dynamic partial reconfiguration of a circuit realized on a programmable integrated circuit (IC)

FIG. 1 is a block diagram of a system 100 for dynamic partial reconfiguration of a circuit 104 realized on a programmable integrated circuit (IC) 106. The realization 104 of the circuit design includes realizations 108-110 of the modules that comprise the circuit design. Block 108 is the realization of a $M_{TBR}$. The realization 104 of the circuit design includes the programmable resources of the programmable integrated circuit 106 configured to operate according to and perform the functions specified by a particular circuit design.

The reconfiguration controller 102 provides a user interface for controlling and managing dynamic partial reconfiguration of the programmable IC 106. In one embodiment, the reconfiguration controller 102 presents a view of the circuit design which allows the user to select the $M_{TBR}$ and the $M_R$. For example, a hierarchical representation of the circuit design may be output to a display device, allowing the user to navigate through the hierarchy to select the desired $M_{TBR}$. Other embodiments may simply list for the user identifying information of modules of the circuit design that are eligible for replacement.

The reconfiguration controller 102 also allows the user to select the $M_R$. In one embodiment, the user may be allowed to specify a module that was not prepared as part of the original circuit design and which the reconfiguration controller has not explicitly presented to the user as an option.

In response to the user having specified the $M_{TBR}$ and the $M_R$, the reconfiguration controller 102 uses design data 112 to determine whether or not the $M_R$ is suitable for replacing the $M_{TBR}$. The design data 112 include metadata 114 of circuit design interfaces, metadata 116 of the $M_R$ interfaces, the circuit design and floorplan 118, and the $M_R$ floorplan 120. The metadata 114 describes interfaces of the circuit design, and the metadata 116 describes interfaces of the $M_R$. The metadata 114 and 116 are used by the reconfiguration controller to determine whether or not the interfaces of the $M_R$ are compatible with the interfaces of the circuit design to which the $M_R$ is to connect. The circuit design and floorplan 118 and the $M_R$ floorplan 120 are used by the reconfiguration controller to determine whether or not the $M_R$ will fit in the space occupied by the $M_{TBR}$. In addition, the floorplan data may be used for determining and implementing signal routes between the $M_R$ and the circuit design. The $M_R$ 122 is used to prepare the configuration data for partially reconfiguring the programmable IC 106, with the $M_R$ replacing the $M_{TBR}$.

Those skilled in the art will recognize suitable systems for connecting a reconfiguration controller to a programmable IC for dynamic partial reconfiguration. In one embodiment, the reconfiguration controller is a computer system that is programmed to perform the operations described herein.

Figure 2:
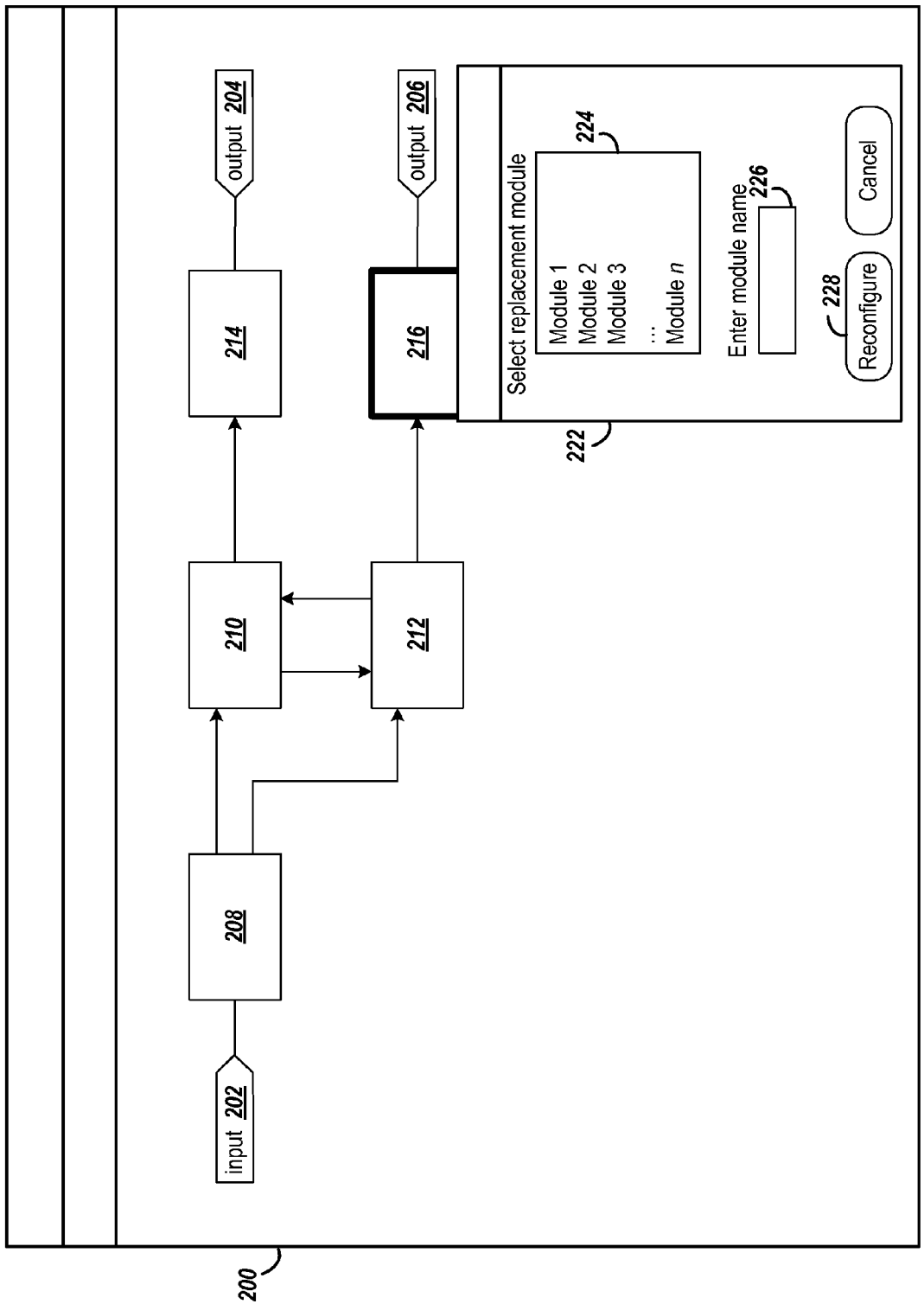
FIG. 2 illustrates an example of a user interface display for controlling dynamic partial reconfiguration of a circuit realized on a programmable integrated circuit.

FIG. 2 illustrates an example of a user interface display 200 for controlling dynamic partial reconfiguration of a circuit realized on a programmable integrated circuit. The display 200 is an example of a window in which a portion of a circuit design is displayed in block format. The portion of the design includes input port 202 and output ports 204 and 206. The functional blocks of the design include blocks 208, 210, 212, 214, and 216. Block 208 is connected to input port 202, block 214 is connected to output port 204, and block 216 is connected to output port 206.

The block diagram illustrates one embodiment 222 that allows a user to navigate to the desired portion of a design for selecting the $M_{TBR}$ and the $M_R$. In another embodiment, a hierarchical list of modules may be displayed alone, or in combination with the block diagram.

In the example shown in FIG. 2, block 216 has been chosen as the $M_{TBR}$. In response to the selection, the user is presented with options for selecting the $M_R$. In one embodiment, the user may be prompted with a list of modules available for selection, such as those shown in block 224. The user may select one of the listed modules using a point-and-click device, for example. In another embodiment, the user may enter the name of the module desired to be used as the $M_R$ as shown by block 226. It will be appreciated that an interface may be provided for browsing to the location of the $M_R$ or the user may enter the path where the $M_R$ is found. These embodiments may be employed alone or in combination. Once the user has specified the $M_R$, the Reconfigure button 228 may be selected to initiate the reconfiguration process.

Figure 3:
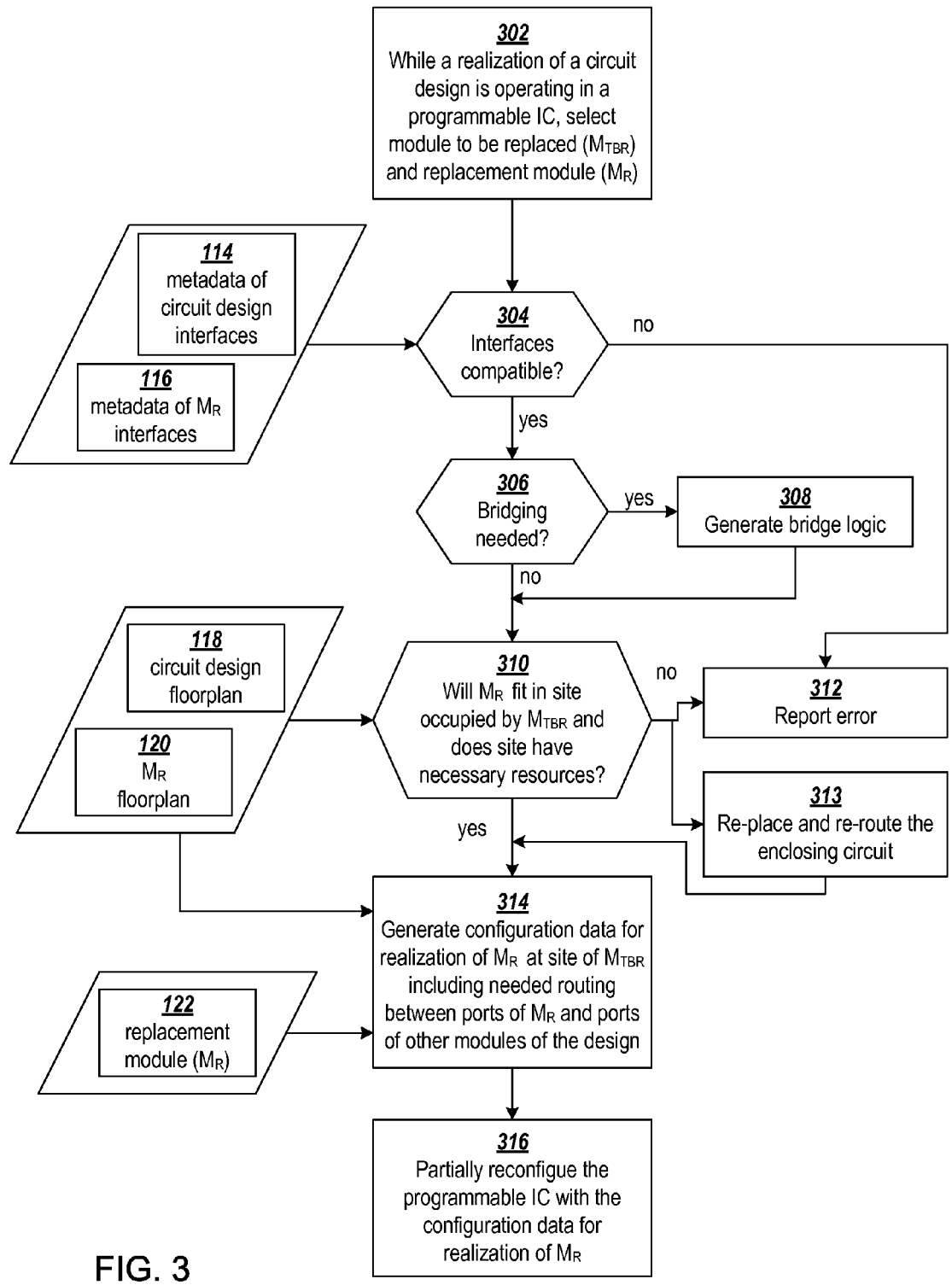
FIG. 3 is a flowchart of an example process for dynamic partial reconfiguration of a circuit realized on a programmable integrated circuit.

FIG. 3 is a flowchart of an example process for dynamic partial reconfiguration of a circuit realized on a programmable integrated circuit. At block 302, the process commences with the selection of the $M_{TBR}$ and the $M_R$ while the realization of the circuit is operating on a programmable IC. Decision step 304 determines whether or not the interfaces of the $M_R$ are compatible with the interfaces of the circuit design where the $M_R$ is to be implemented.

The comparison of interfaces is performed using metadata 114 of the interfaces of the circuit design and metadata 116 of the interfaces of $M_R$. In one embodiment, the metadata that describe the interfaces include the data that are described in U.S. Pat. No. 7,852,117 to Lo et al., which is incorporated herein by reference. In summary, the basic requirements for interface metadata include high-level typing information and low-level typing information. The high-level typing information, for example, distinguishes between streaming interfaces, message interfaces, memory interfaces, and control interfaces. For each of these high-level types, there are specific attributes appropriate to that type. The low-level implementation information, for example, specifies the signal-wise mapping of the interface, along with timing information for the signaling. In addition, the low-level implementation information may identify plug-in tools appropriate to handling signals. An example syntax for representing such metadata is IP-XACT (IEEE 1685).

The example hierarchical interface metadata has three components or layers for an interface. The layers include the behavioral layer, the coding and timing layer, and the signal layer. The behavioral layer contains high-level attributes describing interface behaviors specific to a particular interface type (e.g., particular to a specific module). The types provided for classifying interfaces into specific domains, which avoids having to capture all possible signaling standards and timings. Examples of interface types include packet, memory access, compute-specific, and event notification types. An interface type serves as an entry point for users to describe their interfaces and contains configurable signal-level attributes, such as data bus width and address bus width. Behavioral attributes are organized in a hierarchical fashion as well, with more general behaviors controlling the definition and availability of less general (i.e., lower level) ones. For example, for memory access interfaces, the assertion of bursting enables additional attributes such as burst length, burst type and burst termination. Attributes are defined in a general way, for example, attribute names are strings of characters with no inherent meaning apart from the association of that attribute to lower layer definitions. Attribute values can be of several different types, such as string, integer, or Boolean. Various flags can be associated with attributes for use during interface comparison and resolution.

The purpose of the coding and timing layer is to specify signal timing and coding by describing the dependency between phases of an interface and mapping events to specific signal codes. The coding and timing layer allows for the expansion and redefinition of defined signals, codes, and timing in a pseudo-generic way. This layer is made up of three key components: events, groups, and phases. An event is a decoded meaningful signal assertion that is specific to each interface type. Memory access types can include events such as single read, burst write, and error response, while a packet-type interface can include events such as start-of-packet and end-of-packet.

A group is a bundle of one or more related signals, which includes not only standard buses, such as a data bus and command bus, but also arrangements such as a read-valid signal bundled with a write-valid signal. A phase is an occurrence of a specific and defined pattern of values of signal groups, where the values of signal groups do not change for the duration over which the phase is valid. In addition, groups in a given phase operate in the same direction. A phase, for example, can be the command phase in a memory access type containing the signal groups command bus (such as read- and write-valid) and command qualifiers (such as burst length). A data phase can include the data bus and data bus qualifiers. Dependencies are captured by mapping signal group values (codes) to specific events.

The signal layer describes low-level signal attributes such as port name, net name, signal direction and width. The signal layer may also encompass a number of extended signal parameters such as inversion, padding, justification, byte alignment, edge response, and type.

In one embodiment, the checking for compatibility at block 304 may require complete matching of type, attributes, and attribute values between each interface of the $M_R$ and the corresponding interface of the circuit design. If the interfaces are not compatible, the process proceeds to block 312, where an error is reported to the user. Alternatively, more flexibility may be feasible for some applications where the interface of the $M_R$ and the corresponding interface of the circuit design are not identical. That is, if process block 306 determines that bridging will accommodate slight differences between the interface of the $M_R$ and the corresponding interface of the circuit design, bridge logic is generated at block 308. The bridge logic may include wrappers or convertors to bridge the incompatibilities. For example, two interfaces may have matching behaviors but different data bus widths, and the bridge logic translates between the different bus widths. The bridge logic is combined with the logic 122 of $M_R$.

Once any needed bridge logic is generated and combined with the logic of the $M_R$, the process continues at block 310 which determines whether or not the $M_R$ will fit in the space occupied by the $M_{TBR}$ and whether or not the space occupied by the $M_{TBR}$ has the needed resources for the $M_R$. The available space and resources is determined using floorplan metadata 118 of the circuit design. The required space and resources of the $M_R$ is determined using floorplan metadata 120 of the $M_R$. This floorplan metadata is generally made available by many design tools.

In one embodiment, if the space occupied by the $M_{TBR}$ is too small for $M_R$ or does not have the resources needed for the $M_R$, an error is reported to the user at block 312. In an alternative embodiment, selected portions of the circuit design to which the $M_R$ is to interface may be re-placed and re-routed at block 313 to make room for the $M_R$, and processing may then continue at block 314. In other words, the place-and-route process may be performed on the circuit design with constraints set to reserve room for the $M_R$.

At block 314, the configuration data for realizing the $M_R$ is generated using the specification 122 of the $M_R$, which may include any bridge logic added at block 308. Depending on the form of the $M_R$, the generating of the configuration data may involve standard back-end processing such as synthesis, mapping, and place-and-route. Alternatively, configuration data for some static portions of the $M_R$ may have been previously generated. The metadata of the circuit design floorplan 118 along with the metadata of the $M_R$ floorplan 120 may be used for placing and routing the $M_R$. The metadata giving low-level implementation information can be used to guide the addition of any physical wiring (such as configuring interconnect resources) needed to complete integration of the new module.

At block 316, without resetting the programmable IC, the programmable IC is partially reconfigured with the configuration data for realizing the $M_R$. In instances where the space occupied by the $M_{TBR}$ on the programmable IC is sufficient for the $M_R$ and there are sufficient resources in the space occupied by the $M_{TBR}$ for the $M_R$, the partial reconfiguration leaves intact the configuration of the portion of the circuit that does not include the $M_{TBR}$, and reconfigures the resources in the space occupied by the $M_{TBR}$, with the configuration data to implement the $M_R$. Depending on the application, the part of the circuit that is not reconfigured may continue operating during the partial reconfiguration process.

Figure 4:
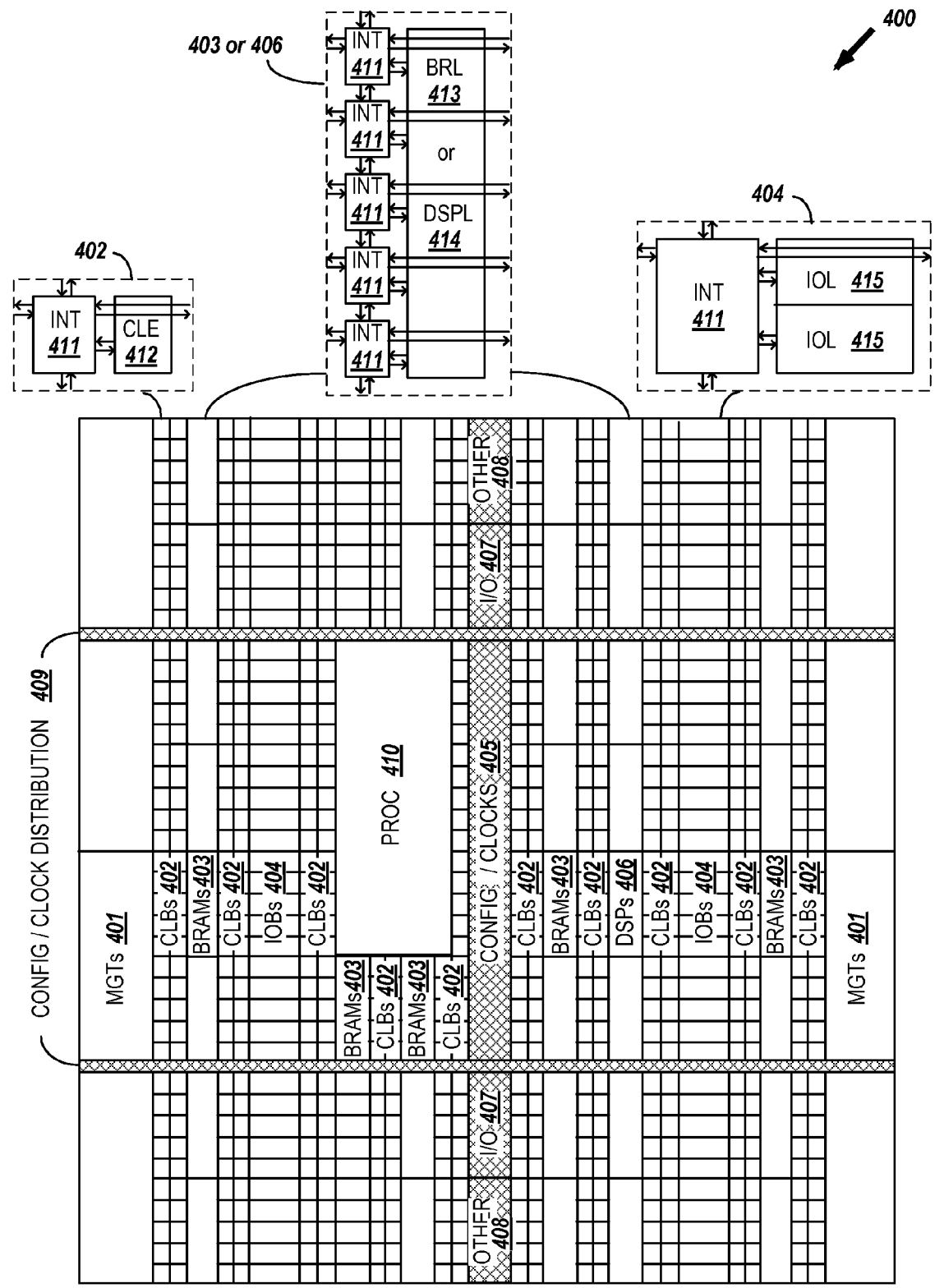
FIG. 4 is a block diagram of an example programmable logic integrated circuit on which a circuit may be realized and dynamically and partially reconfigured.

FIG. 4 is a block diagram of an example programmable logic integrated circuit on which a circuit may be realized and dynamically and partially reconfigured. The example programmable IC is an FPGA. FPGAs can include several different types of programmable logic blocks in the array. For example, FIG. 4 illustrates an FPGA architecture (400) that includes a large number of different programmable tiles including multi-gigabit transceivers (MGTs 401), configurable logic blocks (CLBs 402), random access memory blocks (BRAMs 403), input/output blocks (IOBs 404), configuration and clocking logic (CONFIG/CLOCKS 405), digital signal processing blocks (DSPs 406), specialized input/output blocks (I/O 407), e.g., clock ports, and other programmable logic 408 such as digital clock managers, analog-to-digital converters, system monitoring logic, and so forth. Some FPGAs also include dedicated processor blocks (PROC 410) and internal and external reconfiguration ports (not shown).

In some FPGAs, each programmable tile includes a programmable interconnect element (INT 411) having standardized connections to and from a corresponding interconnect element in each adjacent tile. Therefore, the programmable interconnect elements taken together implement the programmable interconnect structure for the illustrated FPGA. The programmable interconnect element INT 411 also includes the connections to and from the programmable logic element within the same tile, as shown by the examples included at the top of FIG. 4.

For example, a CLB 402 can include a configurable logic element CLE 412 that can be programmed to implement user logic plus a single programmable interconnect element INT 411. A BRAM 403 can include a BRAM logic element (BRL 413) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 406 can include a DSP logic element (DSPL 414) in addition to an appropriate number of programmable interconnect elements. An IOB 404 can include, for example, two instances of an input/output logic element (IOL 415) in addition to one instance of the programmable interconnect element INT 411. As will be clear to those of skill in the art, the actual I/O pads connected, for example, to the I/O logic element 415 are manufactured using metal layered above the various illustrated logic blocks, and typically are not confined to the area of the input/output logic element 415.

In the pictured embodiment, a columnar area near the center of the die (shown crosshatched in FIG. 4) is used for configuration, clock, and other control logic. Horizontal areas 409 extending from this column are used to distribute the clocks and configuration signals across the breadth of the FPGA.

Some FPGAs utilizing the architecture illustrated in FIG. 4 include additional logic blocks that disrupt the regular columnar structure making up a large part of the FPGA. The additional logic blocks can be programmable blocks and/or dedicated logic. For example, the processor block PROC 410 shown in FIG. 4 spans several columns of CLBs and BRAMs.

Note that FIG. 4 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 4 are purely exemplary. For example, in an actual FPGA, more than one adjacent column of CLBs is typically included wherever the CLBs appear to facilitate the efficient implementation of user logic.

Those skilled in the art will appreciate that various alternative computing arrangements, including one or more processors and a memory arrangement configured with program code, would be suitable for hosting the processes and data structures of the different embodiments of the present invention. In addition, the processes may be provided via a variety of computer-readable storage media or delivery channels such as magnetic or optical disks or tapes, electronic storage devices, or as application services over a network.

The embodiments are thought to be applicable to a variety of systems for dynamic partial reconfiguration. Other aspects and embodiments will be apparent to those skilled in the art from consideration of the specification. It is intended that the specification and illustrated embodiments be considered as examples only, with a true scope and spirit of the invention being indicated by the following claims.

What is claimed is:

1. A method of dynamically reconfiguring a programmable integrated circuit (IC), including:
   in response to user input to a reconfiguration controller, by computer, while a circuit is operating in programmable resources of the programmable IC, selecting a replacement module and a module to be replaced in the circuit;
   determining, while the circuit is operating in the programmable IC, whether or not interfaces of the replacement module are compatible with interfaces of the circuit to the module to be replaced; and
   in response to the interfaces of the replacement module and the interfaces of the circuit to the module to be replaced being compatible, partially reconfiguring the programmable IC with a realization of the replacement module in place of a realization of the module to be replaced.

2. The method of claim 1, wherein the determining whether or not the interfaces are compatible includes using metadata that describe behavior of the interfaces of the circuit and that describe behavior of the interfaces of the replacement module.

3. The method of claim 2, wherein the metadata that describe the interfaces of the module to be replaced is formatted in a hierarchical description of behavior of the interfaces, with interface types at a top level of the hierarchical description and attributes hierarchically organized below the interface types.

4. The method of claim 3, wherein a bottom level of the hierarchical description includes signal descriptions.

5. The method of claim 3, wherein the types of interfaces include one or more of packet, memory access, compute-specific, and event notification.

6. The method of claim 1, wherein the determining of compatibility of the interfaces includes:
   verifying, for each interface of the circuit design connected to an interface of the module to be replaced, that there is one corresponding interface in the replacement module having an equivalent type.

7. The method of claim 1, wherein the determining whether or not the interfaces are compatible includes:
   determining for each interface of the replacement module whether or not the interface is compatible, but dissimilar, with the corresponding interface of the circuit design; and
   automatically generating an intermediary component that connects an interface of the replacement module to the corresponding interface of the circuit design in response to determining that the interface is compatible and dissimilar.

8. The method of claim 1, further comprising, in response to the interfaces of the replacement module and the interfaces of the circuit to the module to be replaced being compatible, determining placement of the replacement module in the programmable IC from metadata that describe placement of the circuit and the module to be replaced.

9. The method of claim 1, further comprising:
   determining whether or not the replacement module fits in a site of the programmable IC occupied by the module to be replaced; and
   in response to determining that the replacement module does not fit in the site of the programmable IC occupied by the module to be replaced, denying the partial reconfiguration of the programmable IC and outputting an error message.

10. The method of claim 1, further comprising:
    determining whether or not the replacement module fits in a site of the programmable IC occupied by the module to be replaced; and
    in response to determining that the replacement module does not fit in the site of the programmable IC occupied by the module to be replaced, re-placing and re-routing a circuit design of the circuit while reserving space for the replacement module.

11. The method of claim 1, further comprising:
determining whether or not all programmable resources required by the replacement module are available in a site occupied by the module to be replaced; and
in response to determining that all the programmable resources required by the replacement module are not available in the site occupied by the module to be replaced, denying the partial reconfiguration of the programmable IC and outputting an error message.

12. The method of claim 1, further comprising:
determining whether or not all programmable resources required by the replacement module are available in a site occupied by the module to be replaced; and
in response to determining that all the programmable resources required by the replacement module are not available in the site occupied by the module to be replaced, re-placing and re-routing a circuit design of the circuit while reserving space for the replacement module.

13. The method of claim 1, further comprising generating configuration data that implements the replacement module and connections to the circuit.

14. A system for dynamically reconfiguring a programmable integrated circuit (IC), including:
a memory arrangement configured with processor-executable instructions; and
at least one processor coupled to the memory arrangement;
wherein execution of the instructions by the at least one processor causes the at least one processor to perform operations including:
in response to user input to a reconfiguration controller while a circuit is operating in programmable resources of the programmable IC, selecting a replacement module and a module to be replaced in the circuit;
determining, while the circuit is operating in the programmable IC, whether or not interfaces of the replacement module are compatible with interfaces of the circuit to the module to be replaced; and
in response to the interfaces of the replacement module and the interfaces of the circuit to the module to be replaced being compatible, partially reconfiguring the programmable IC with a realization of the replacement module in place of a realization of the module to be replaced.

15. The system of claim 14, wherein:
the determining whether or not the interfaces are compatible includes using metadata that describe behavior of the interfaces of the circuit and that describe behavior of the interfaces of the replacement module;
the metadata that describe the interfaces of the module to be replaced is formatted in a hierarchical description of behavior of the interfaces, with interface types at a top level of the hierarchical description and attributes hierarchically organized below the interface types;
a bottom level of the hierarchical description includes signal descriptions; and
the types of interfaces include one or more of packet, memory access, compute-specific, or event notification.

16. The system of claim 14, wherein the determining of compatibility of the interfaces includes:
verifying, for each interface of the circuit design connected to an interface of the module to be replaced, that there is one corresponding interface in the replacement module having an equivalent type.

17. The system of claim 14, wherein the determining whether or not the interfaces are compatible includes:
determining for each interface of the replacement module whether or not the interface is compatible, but dissimilar, with the corresponding interface of the circuit design; and
automatically generating an intermediary component that connects an interface of the replacement module to the corresponding interface of the circuit design in response to determining that the interface is compatible and dissimilar.

18. The system of claim 14, wherein the operations further comprise, in response to the interfaces of the replacement module and the interfaces of the circuit to the module to be replaced being compatible, determining placement of the replacement module in the programmable IC from metadata that describe placement of the circuit and the module to be replaced.

19. The system of claim 14, wherein the operations further comprise:
determining whether or not the replacement module fits in a site of the programmable IC occupied by the module to be replaced;
determining whether or not all programmable resources required by the replacement module are available in the site occupied by the module to be replaced; and
in response to determining that the replacement module does not fit in the site of the programmable IC occupied by the module to be replaced, or determining that all programmable resources required by the replacement module are not available, denying the partial reconfiguration of the programmable IC and outputting an error message.

20. The system of claim 14, wherein the operations further comprise:
determining whether or not the replacement module fits in a site of the programmable IC occupied by the module to be replaced;
determining whether or not all programmable resources required by the replacement module are available in the site occupied by the module to be replaced; and
in response to determining that the replacement module does not fit in the site of the programmable IC occupied by the module to be replaced, or determining that all programmable resources required by the replacement module are not available, re-placing and re-routing a circuit design of the circuit while reserving space for the replacement module.

* * * * *